United States Patent [19]

Weinstein

[11] Patent Number: 4,794,206
[45] Date of Patent: Dec. 27, 1988

[54] RF SHIELDED AND ACOUSTIC ROOM

[75] Inventor: Jonathan Weinstein, Wantagh, N.Y.

[73] Assignee: Industrial Acoustics Company, Inc., Bronx, N.Y.

[21] Appl. No.: 932,622

[22] Filed: Nov. 20, 1986

[51] Int. Cl.⁴ .............................................. H05K 9/00
[52] U.S. Cl. ................................ 174/35 MS; 16/354; 181/290
[58] Field of Search ............... 174/35 GC, 35 MS; 361/429; 181/284, 290; 52/285; 49/400; 16/354

[56]  References Cited

U.S. PATENT DOCUMENTS

| | | | |
|---|---|---|---|
| 2,066,718 | 1/1937 | Dietz | 174/35 MS |
| 2,516,935 | 8/1950 | Weaver | 16/354 |
| 2,667,242 | 1/1954 | Kullmer | 52/285 |
| 2,757,225 | 7/1956 | Dunn | 174/35 |
| 2,838,592 | 6/1958 | Feketics | 174/35 MS |
| 2,927,665 | 3/1960 | Hauf | 181/290 |
| 3,009,984 | 11/1961 | Lindgren | 174/35 |
| 3,013,103 | 12/1961 | Pettler et al. | 174/35 MS |
| 3,130,651 | 4/1964 | Werner | 49/400 |
| 3,153,692 | 10/1964 | Lindgren | 174/35 MS |
| 3,159,093 | 12/1964 | Rosenfeld | 49/400 |
| 3,236,935 | 2/1966 | Patton | 174/35 |
| 3,256,384 | 6/1966 | Lindgren | 174/35 |
| 3,304,360 | 2/1967 | Hadley et al. | 174/35 GC |
| 3,322,879 | 5/1967 | Lindgren | 174/35 MS |
| 3,437,735 | 4/1969 | Schaller, Jr. | 174/35 MS |
| 3,507,974 | 4/1970 | Clark et al. | 174/35 |
| 3,518,355 | 6/1970 | Luce | 174/35 |
| 3,783,174 | 1/1974 | Lindgren | 174/35 MS |
| 3,790,696 | 2/1974 | Lindgren | 174/35 MS |
| 4,016,689 | 4/1977 | Wendt | 181/284 |
| 4,177,353 | 12/1979 | McCormack | 174/35 GC |
| 4,370,831 | 2/1983 | Hamilton | 49/477 |
| 4,572,921 | 2/1986 | May et al. | 174/35 GC |

FOREIGN PATENT DOCUMENTS

| | | | |
|---|---|---|---|
| 250274 | 2/1964 | Netherlands | 174/35 GC |
| 744723 | 2/1956 | United Kingdom | 52/285 |

OTHER PUBLICATIONS

"Lectroshield Model LDC/LDP RF Shielded Rooms", Lectromagnetics, Inc., Bulletin LDC-500B, 6-1981.
"Rayshield Radio Frequency Shielded Enclosures", Rayshield brochure on Class-10 STD.
"Series '81", Rayproof Catalog No. 812.
"Series 85 Radio Frequency and Audio Shielded Rooms", Rayproof Corporation.
Belling Lee Intec Ltd. Brochure, "Electromagnetic Shielded Enclosures", 1986.
"Radio Frequency Shielded Enclosure", Euroshield Series DS-82 brochure.
Euroshield Fact Sheets on Euroshield RFD-100-Door, RFD-60-Door, RFD-60-Double Door, EMPD-60-Double Door, EMPD-60-Door.
"RF Shielded Rooms", Lectro Magnetics, Inc. Catalog LSR-2000, 6-1986.
"RF-Tightness Using Resilient Metallic Gaskets", pp. 116 & 123, Electrical Manufacturing.
Kessler Sales Corporation Information Sheet, "R.F. Enclosure", Fremont, Ohio.

Primary Examiner—Arthur T. Grimley
Assistant Examiner—David A. Tone
Attorney, Agent, or Firm—Morgan & Finnegan

[57]  ABSTRACT

In a room that is RF shielded and acoustically insulated, a plurality of panels are fastened together to form a self-supported structure. The panels are fabricated from a continuous metal sheathing and filled with acoustic insulating material. The panels are fastened together by joiners and compression clamps. Structural steel tubing can be fastened between the panels when additional structural strength is required. Access to the interior of the room is provided by a metal door that is filled with acoustic insulating material. The door also includes both RF and acoustic seals. The door is equipped with special hinges that enable the door to be flush mounted and to be opened 180°.

20 Claims, 9 Drawing Sheets

RF SHIELDED AND ACOUSTIC ROOM

BACKGROUND OF THE INVENTION

1. Field of the Invention

The present invention relates generally to electromagnetic wave shielded rooms and more specifically to an RF or radio shielded room which is also acoustically insulated.

2. Description of the Prior Art

RF or radio frequency shielded rooms are often found in laboratories to protect scientific instruments from stray electromagnetic radiation. They are also found in data processing centers to protect the integrity of data files from electromagnetic radiation. In addition, they are often used to prevent electronic evedropping. Representative examples of RF shielded rooms and the doors to seal such rooms are described in U.S. Pat. Nos. 4,370,831, 4,177,353, 3,518,355, 3,507,974, 3,256,384, 3,236,935, 3,009,984 and 2,757,225.

The above referenced patents generally describe RF shielded rooms that are fabricated from sheets of wood or particle board which are covered with metal. The RF shielded rooms also include special doors which seal the room. This type of RF shielding is usually attached to the frame of the existing room which is being shielded or requires framing to be built to support the RF panels. Accordingly, those RF panels are not inherently self-supporting.

In addition, known RF shielded rooms typically become less reliable in their shielding characteristics over time. They also are generally not fully demountable and reassemblable. That is, once known rooms are dissassembled they generally cannot be reassembled because in the assembly process known panels undergo some distortion which makes it virtually impossible to reassemble the panels without an attendant undesirable RF leakage.

There is also an additional problem in sealing the doors to these known shielded rooms because any crack or aperture between the door and the frame will degrade the quality of the RF shielding. Two approaches have generally been used to provide sealing of the doors. The first approach makes use of a door seal that has a groove with flexible metallic fingers. When the door is shut, a projection from the door is inserted into the metallic fingers, thereby sealing the gaps which would otherwise exist. The second approach includes inflatable conductive gaskets which seal the gaps between the door and its frame. Prior art door seals result in doors which often are not aesthetically pleasing. These doors are typically surface mounted, i.e., they are not flush with the wall, and they make it readily apparent that the room is being utilized for some special purpose.

In addition to the drawbacks mentioned above, known RF shielded rooms are not inherently soundproof. While prior art RF panels have some minimal sound insulating properties, these properties are quite small. Thus, in order to provide adequate acoustic insulation, conventional sound proofing techniques must be used within known RF shielded rooms. This results in a "room within a room" arrangement, i.e., the soundproof walls are built within the RF shielded walls or vice-versa. This arrangement is very time consuming and expensive. The contractor must install two sets of panels and must ensure that the installation of the acoustic insulation does not interfere with the RF shielding.

Accordingly, there is a need for a room which can provide both RF shielding and acoustic insulation and eliminate the necessity of building "a room within a room". There is also a need for such a room which retains its RF shielding and acoustic insulation characteristics over time and which are fully demountable and reassemblable. There is also a need for an aesthetically pleasing door for sealing such rooms.

SUMMARY OF THE INVENTION

The present invention provides a self-supporting room that is both RF or radio frequency shielded and acoustically insulated. The room is fabricated from panels which have a continuous metallic sheathing that is filled with acoustic insulating material, such as fiberglass. The panels are fastened together by H-shaped joiners which are inserted between the panels. The H-shaped joiner incorporates an offset to accommodate RF shielding gasket material. Channel shaped compression members are disposed above and below the flanges of the H-shaped member and are fastened together by bolts which pass through the H-shaped member. The fasteners form an RF seal between adjacent panels. Edge and corner panels seal the corners and edges of the room. Access to the room may be provided by a flush mounted door with particular hinge and seal configurations.

DETAILED DESCRIPTION OF THE INVENTION

Figure 1:
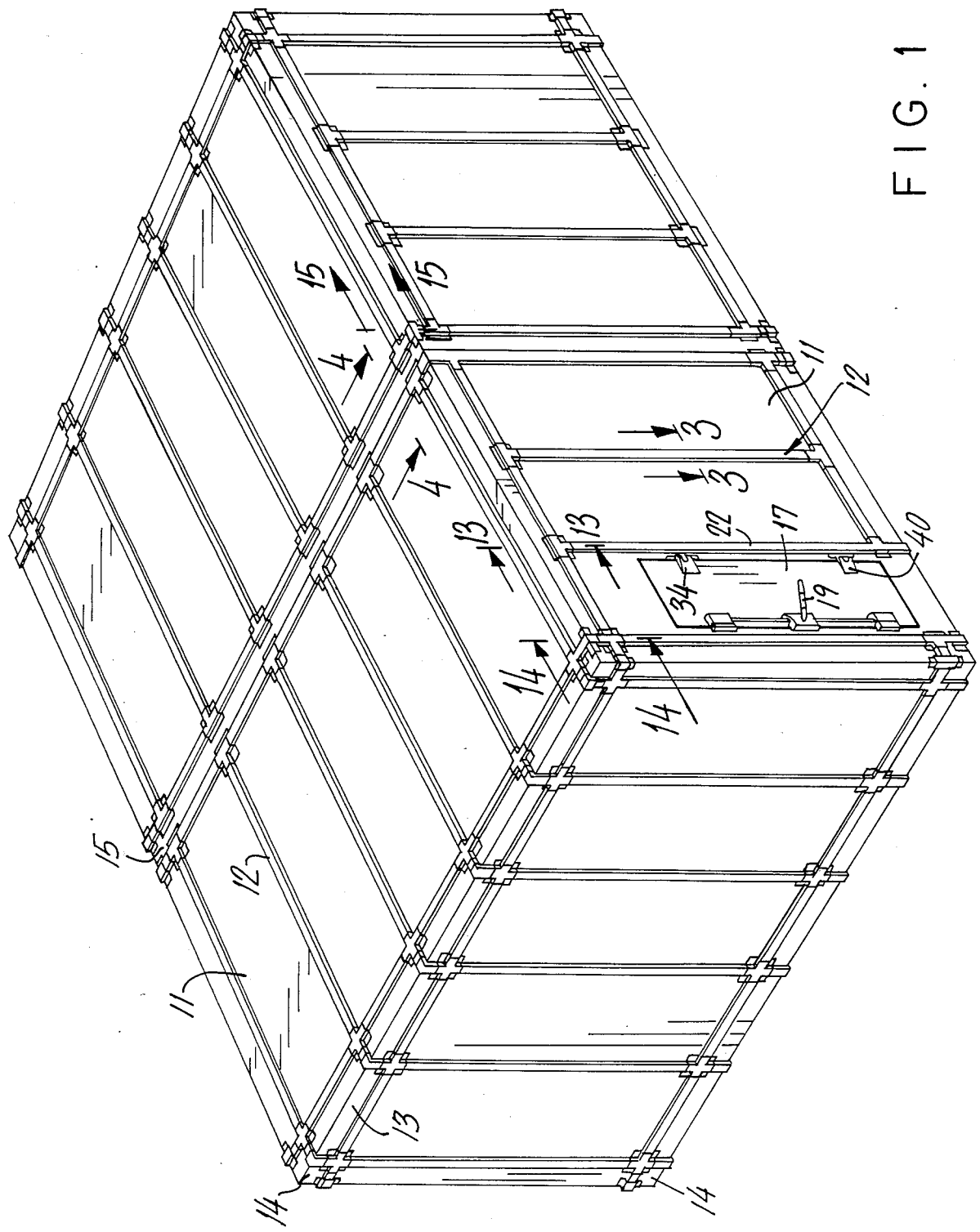
FIG. 1 is a perspective view of the RF shielded and acoustically insulated room of the present invention.

Referring to FIG. 1, a perspective view illustrates the EM (electromagnetic wave) shielded and acoustically insulated room 10 or enclosure of the present invention.

For the sake of convenience the electromagnetic shielding will be refered to as RF shielding but is not intended as a limitation on the particular frequency of the electromagnetic waves shielded by the invention.

The room 10 is fabricated from a plurality of panels 11 that are fastened together. Two panels 11 lying in the same plane are fastened along a joint 12 with a clamping device hereinafter described in greater detail. Edge pieces 13 are used to join panels 11 lying in two different planes, and corner pieces 14 are used to join panels 11 lying in three different planes and intersecting to form a corner. When long ceiling spans are encountered, a structural steel tube 15 may be used to give the room 10 greater structural strength (See also FIGS. 4 & 5). At the corners of the panels 11, caps are used to seal the joints 12 for shielding purposes. As will be described in more detail below, the caps may have different shapes, e.g. "T", "X" or "L" depending upon the number of joints being sealed and the location of the seal. The room 10 includes an access door 17 and a multi-point cam seal latch system 19.

Figure 2:
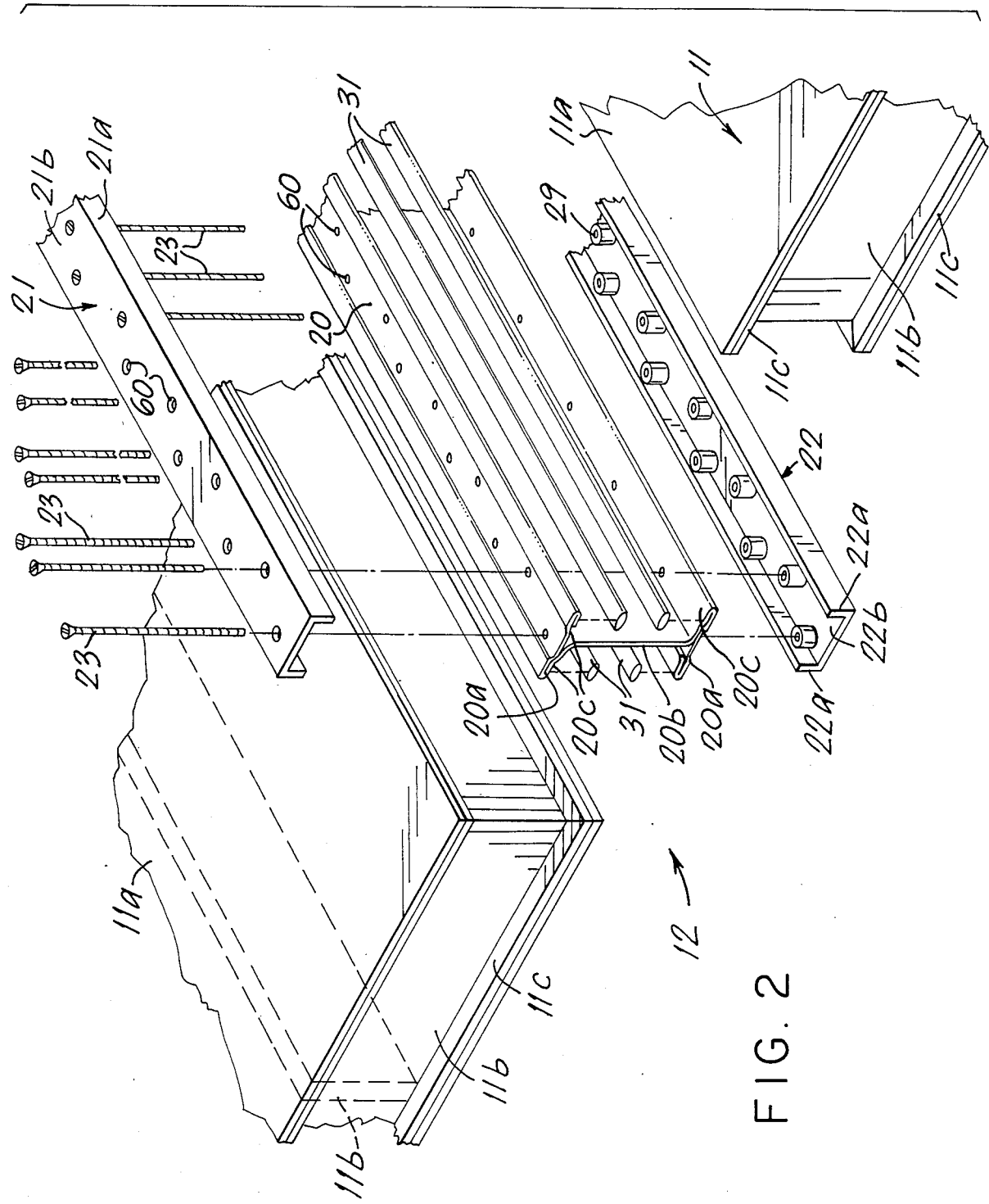
FIG. 2 is a partial exploded perspective view of a pair of panels and the joint formed therebetween.
Figure 3:
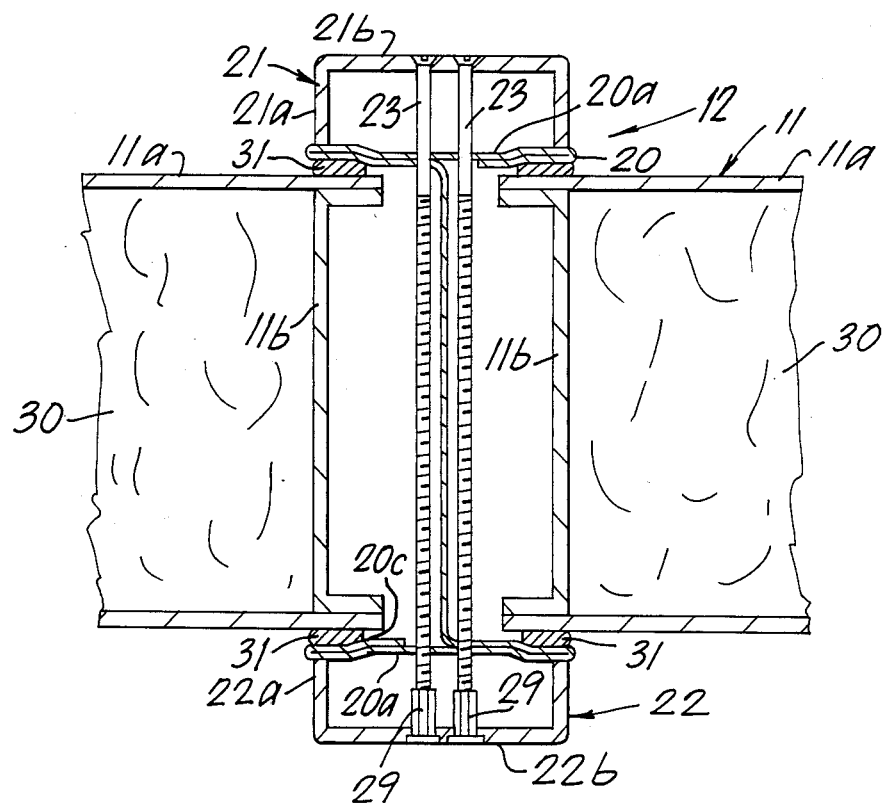
FIG. 3 is a cross sectional view of the joint of FIG. 2.
Figure 4:
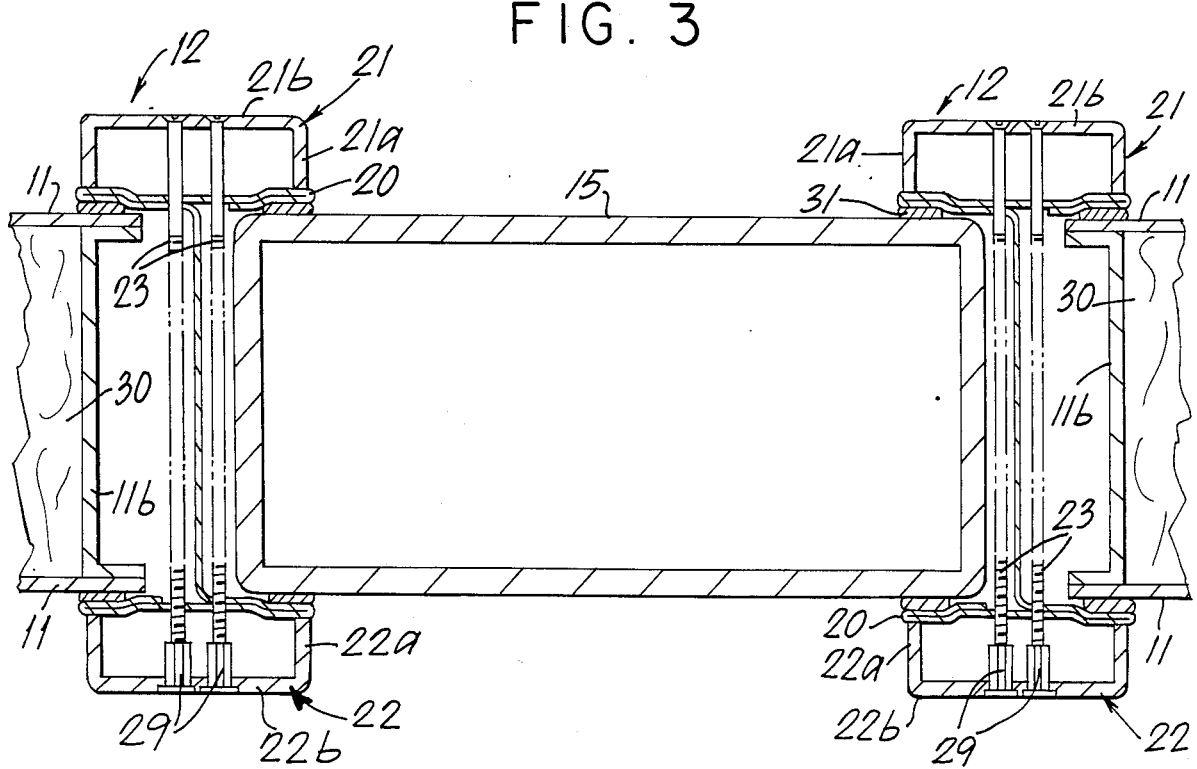
FIG. 4 is a cross sectional view of a joint formed between a pair of panels and a structural steel member.

FIGS. 2-4 illustrate the joint assembly 12 for joining together in the same plane a pair of panels 11. These panels, which provide RF shielding and acoustic insulation, are used in the construction of walls, roofs and floors. As illustrated in the Figures, each panel 11 comprises a pair of spaced apart face sheet members 11a which are separated by internal and peripheral wall or support portions 11b. Preferably face members 11a extend beyond wall portions 11b to form peripheral edge portions 11c around the periphery of the panel.

Preferably face members 11a and support portions 11b are formed from an RF shielding material e.g., galvanized steel. When galvanized steel is used the walls 11b may be spotwelded to the face sheets 11a. By way of further example, panels 11 may be fabricated from suitable gauge galvanized steel, (e.g. 18 ga, 14 ga, 16 ga, 12 ga, 11 ga) with the face sheets spaced apart several inches. The support members 11b may be arranged, for example, 24" on center and spot welded to face sheets 11a 241 on center.

In the preferred embodiment of the invention, the interior of each panel 11 is filled with a suitable acoustic insulating material 30 such as fiberglass.

In an alternate embodiment of the invention each of the opposed face sheets 11a of panels 11 may be formed from a different material. In addition, in certain applications it is enough for only one of the opposed face sheets 11a of each panel 11 to have the desired RF shielding characteristics, with the other face sheet simply serving to close the panel and retain the acoustic fill 30.

In another embodiment of the invention, one of the panel face sheets 11a may be perforated to provide the desired acoustic insulation (i.e., sound absorption as well as acoustic shielding).

In a further embodiment of the invention, the panels 11 may be of the "packless" type, i.e. the type in which the acoustic insulation is not provided by an acoustic fill, but rather by the configuration of portions of the panel. For an example of a packless type of acoustic panel reference is made to U.S. Pat. No. 4,287,962 (issued on Sept. 8, 1981 and assigned to the assignee of the present invention) and the prior art cited therein. In connection with the packless type panel, it is also conceivable that one of the panel face sheets is solid while the opposing face sheet is perforated for acoustic reasons.

Referring now again to FIGS. 2-4, the joint assembly 12 comprises a flexible, generally H-shape RF-acoustic compression joiner 20 which is receivable between a pair of compression channel members 21 and 22. Joiner 20 includes a pair of opposed flange portions 20a joined by a substantially perpendicular support portion 20b. Compression channels 21 and 22 are generally U-shaped in configuration, having a pair of leg members 21a, 22a joined by a generally perpendicular base portion 21b, 22b.

Compression channel member 21 and joiner 20 include apertures 60 for receiving clamping bolts 23. Preferably, the heads of bolts 23 are countersunk in compression channel 21. Nut members 29 are captured in compression member 22 for receiving and securing clamping bolts 23. Where nuts 29 are hexagonal, they may be captured in compression channel 22, for example, by means of hexagonal apertures in compression channel 22 which receive and hold the nuts.

As shown in the Figures the edges of a pair of panels 11 which are to be joined together are clamped between the flange portions of joiner 20 by compression channels 21 and 22. In accordance with the invention, an RF sealing material 31 is sandwiched between the joiner flanges 20a and the edges of the panels 11. Sealing material 31 may comprise, for example, a wire mesh gasket material or a conductive caulk. In the preferred embodiment of the invention, joiner flange portions 20a include offsets or recessed portions 20c for receiving the RF sealing material 31.

In operation, compression channels 21 and 22 compress the RF sealing material 31 between the "H" joiner 20 and the panel 11. As illustrated best in FIG. 3, the legs of compression channel members 21 and 22 are preferably substantially aligned with the wall or support portions 11b of the panels 11. The RF shielding material 31 acts as a metal gasket between joiner flanges 20a and the surface of panels 11 ensuring electrical continuity between adjacnnt panels 11. The compression channels 21, 22, which may be bolted on 4" centers, provide high uniform compression loads along the entire length of the joint 12. Due to the flexibility or spring nature of the compression channels 21, 22, this uniform clamping action is maintained without the need for periodic re-torquing of the compression bolts 23 even with deformations and stresses resulting from wind buffeting, thermal expansion and contraction, or applied live loads.

Referring now to FIG. 4, a cross-sectional view illustrates the joint formed between a structural steel member 15 and two panels 11. The structural steel member can for example, be a standard 8"×4" steel tube. The structural steel member 15 is held between the two panels 11 by two H-shaped joiners 20. The joiners 20 are held in place by compression channels 21, 22 and bolts 23 as described above.

Figure 5:
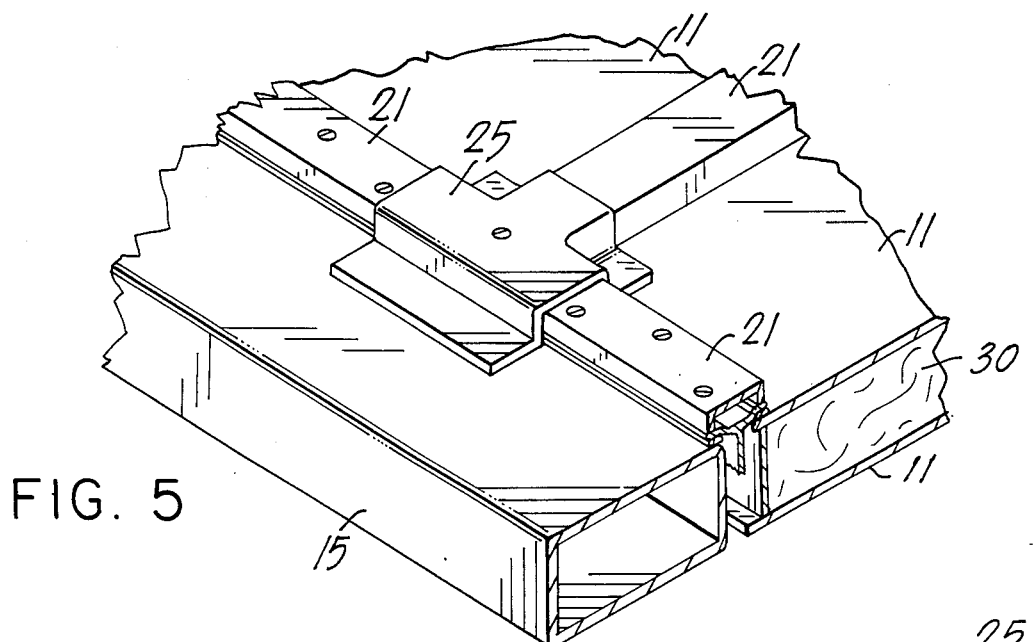
FIG. 5 is a perspective view of a cap used to seal the intersections between joints.
Figure 5A:
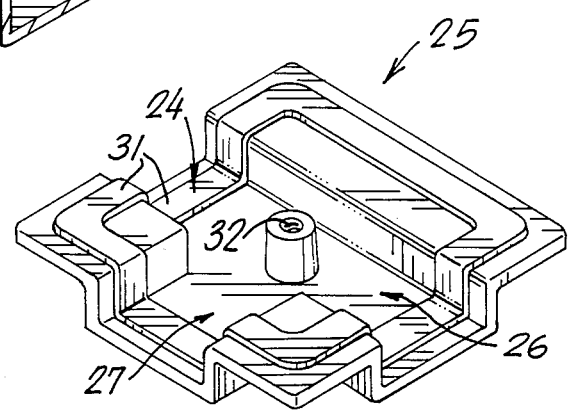
FIG. 5A is a perspective view of the interior of the cap of FIG. 5.

Referring now to FIG. 5, a perspective view illustrates a "T" shaped cap 25 which is used to seal the intersection formed among three compression channels 21. Such intersections occur, for example when the two panels 11 are joined to a structural steel member 15. Without the cap 25 the intersection would not be tightly sealed, and any resulting apertures could adversely affect the RF shielding properties of the room 10. In FIG. 5A an enlarged perspective view illustrates the interior of the cap 25. Openings 24, 26 and 27 of the cap 25 accommodate the compression channels 21. Around the interior of the cap 25, RF gasketing 31, of the same type discussed earlier in connection with joint assembly 12, is disposed. Preferably, cap 25 includes a peripheral recess for seating gasketing material 31. The cap 25 also includes an aperture 32 for a bolt which is used to secure the cap 25 to the compression channels 21. The cap 25 insures RF shielding continuity.

It will be appreciated that in addition to the exterior type cap members exemplified in FIGS. 5 and 5a, the subject invention also provides for complementary interior type cap members which are disposed in the interior surface of the subject enclosure, the interior and exterior cap members being fastened to one another.

Figure 13:
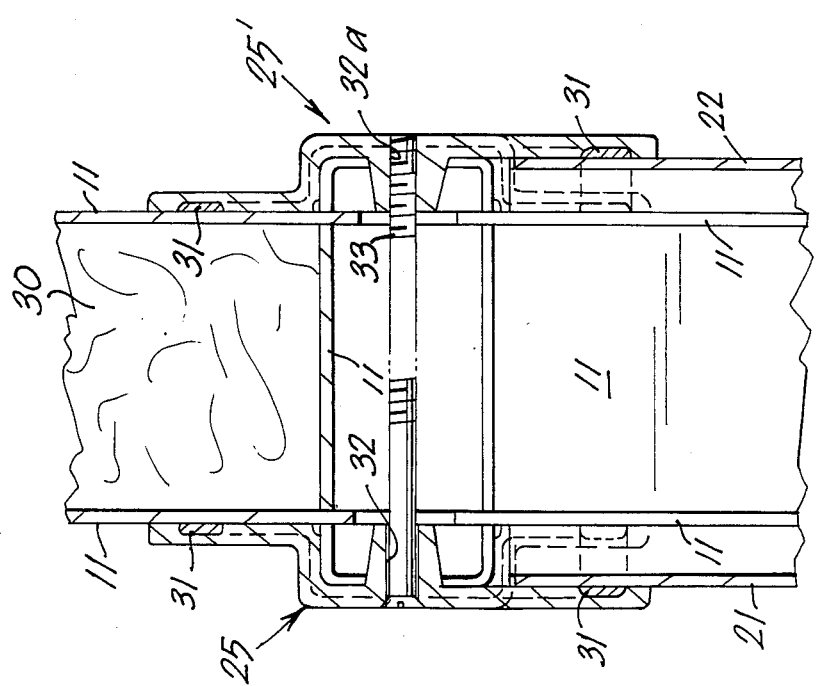
FIG. 13 is a cross sectional view of "T" shaped cover member taken along line 13—13 of FIG. 1.

For example, referring to FIG. 13, there is illustrated an assembly wherein interior and exterior "T" shaped type caps are used to join and seal an intersection formed among three sets of compression channels 21 and 22. Cap member 25 is an exterior type cap member similar to that illustrated in FIGS. 5 and 5a. Cap member 25' is an interior cap, and as can be seen in the Figure is virtually identical to the exterior cap except that the interior cap includes a threaded aperture 32a for receiving fastening bolt 33. As is also shown in FIG. 13, the interior cap 25' includes openings for accommodating compression channels 22. Cap 25' also includes RF gasketing 31 around its interior to seal between cap 25' and compression member 22 and panel 11.

Figure 14:
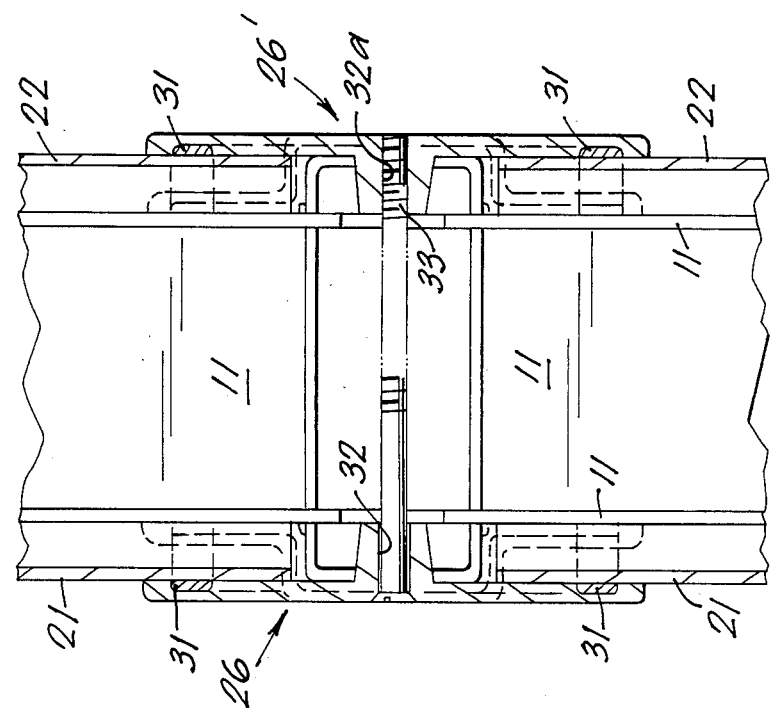
FIG. 14 is a cross eectional view of an "X" shaped cover member taken along line 14—14 of FIG. 1.

FIG. 14 illustrates exterior and interior "X" shaped type cap members, 25a and 25a', respectively, that are used to join and seal an intersection formed among four sets of compression channels 21 and 22. The structure of "X" shaped type cap members 25a and 25a' is very similar to that of "T" shape caps 25 and 25' except for the inclusion of an additional aperture in each of caps 25 and 25a' for accommodating a fourth set of compression channels 21 and 22. Caps 25a and 25a' each include RF gasketing material 31 around their periphery and they each preferably include a recess for seating the RF gasketing material.

Figure 15:
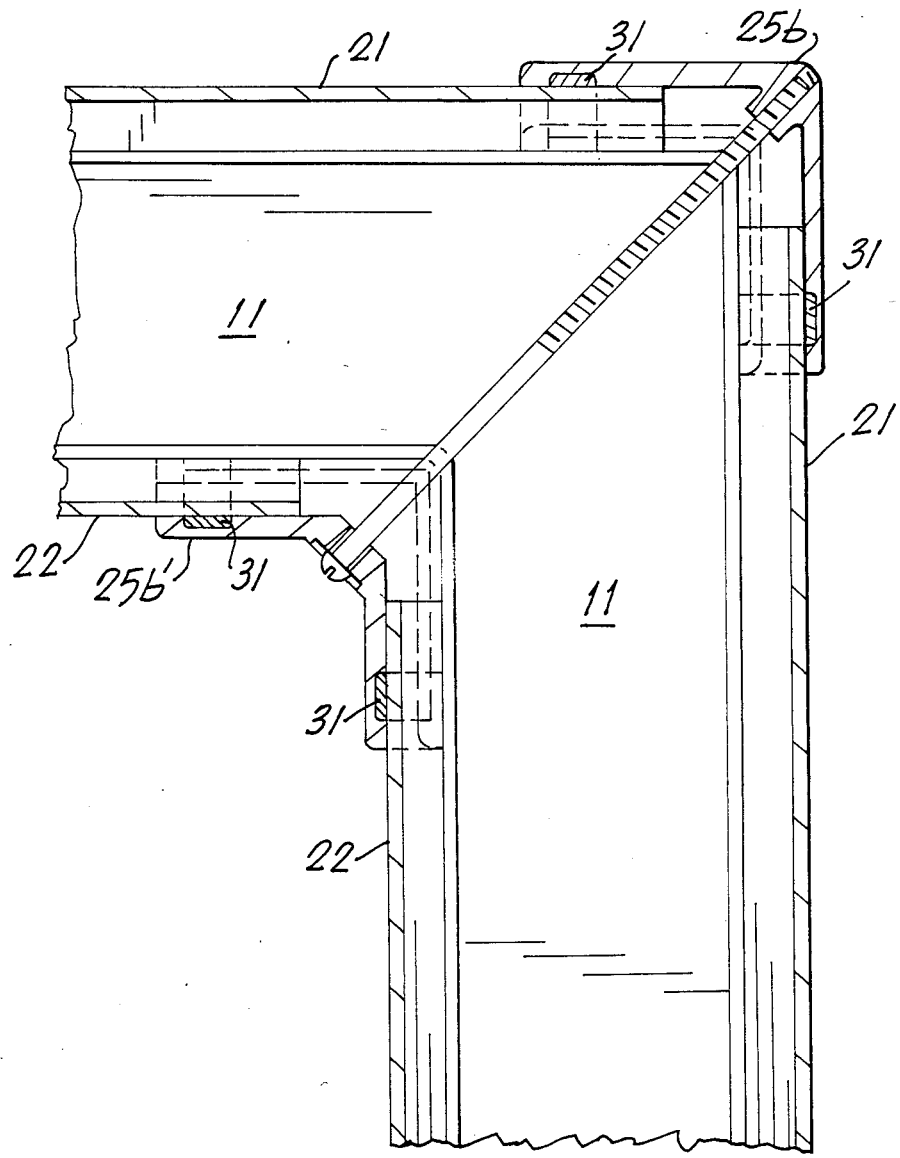
FIG. 15 is a cross sectional view of a corner cover member taken along line 15—15 of FIG. 1.

FIG. 15 illustrates exterior and interior generally "L" shaped corner cap members 25b and 25b', respectively, that are used to join and seal an intersection of two sets of compression channels 21 and 22 in corner portions of the enclosure. Each cap member 25b and 25b' includes an aperture for receiving a compression channel member. In addition, each cap member 25b and 25b' includes RF gasketing material around its periphery. As with the other cap members, it is preferable that each cap member 25b and 25b' include a peripheral recess for seating the RF gasketing material.

Figure 6:
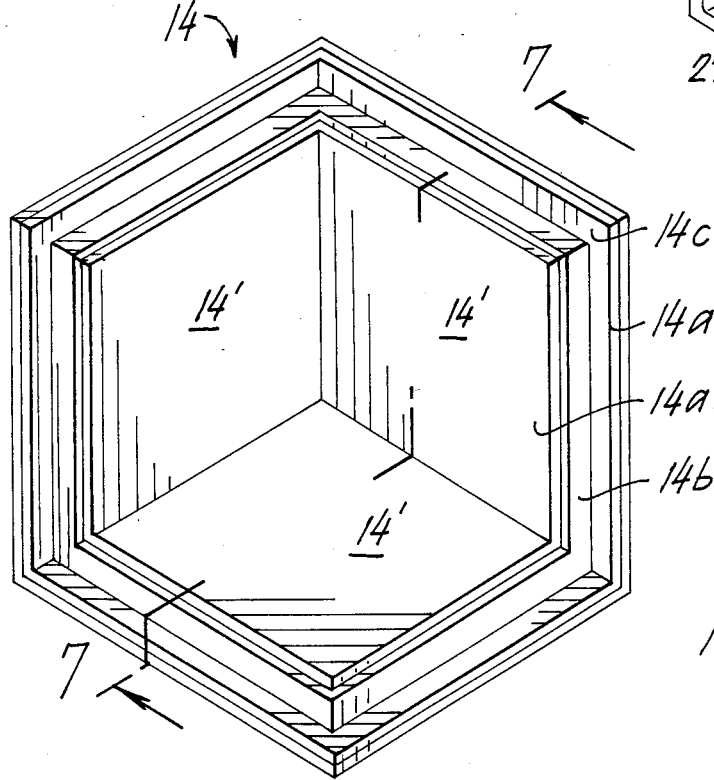
FIG. 6 is a perspective view of a corner piece for the intersection of three panels.
Figure 7:
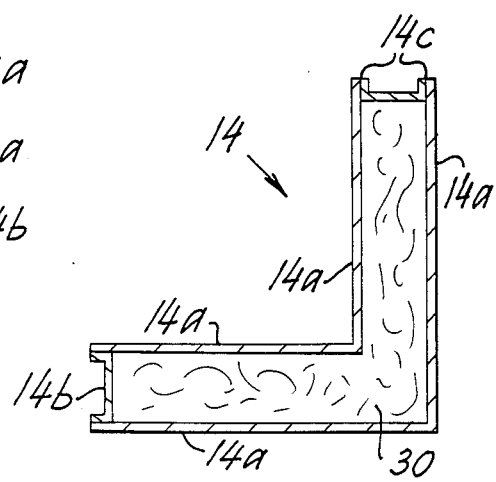
FIG. 7 is a cross sectional view of the corner piece taken along line 7—7 of FIG. 6.

FIG. 6 illustrates a perspective view of the corner pieces 14 which are used at the intersection of two walls and the ceiling or two walls and the floor. Corner pieces 14 or "tri-corner" panels may be preseamed and prefabricated, thereby avoiding troublesome three-way clamped corner connections. In FIG. 7 a cross-sectional view taken along line 7—7 of FIG. 6 illustrates the interior of the corner piece 14. As illustrated, corner pieces 14 comprise three panel portions 14' which are joined substantially orthogonally to one another to form a corner. Each of the corner panel portions includes a pair of spaced apart, opposed face sheets 14a which are joined by a wall or support portion 14b. Preferably, the sheets 14a extend beyond their respective support portions 14b to form lip portions 14c around the periphery of the panels. The materials that are used to form the corner panel portions may be the same as those described above in connection with panels 11 (e.g. all or partially RF shielding material). Preferably, the interior portions of corner pieces 14 include an acoustic fill 30 as described above in connection with panels 11.

Figure 8:
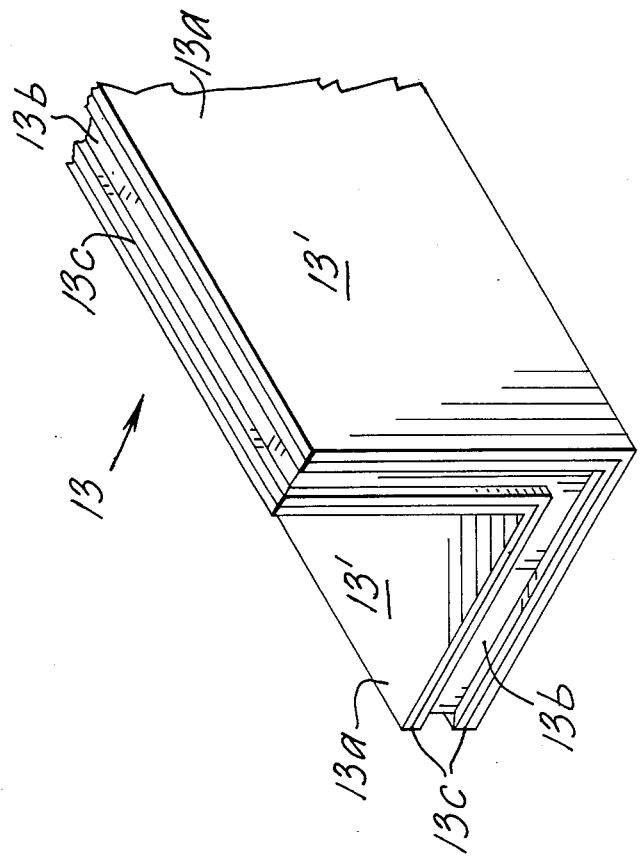
FIG. 8 is a perspective view of an edge piece for the intersection of two panels.

Referring now to FIG. 8, a perspective view illustrates an edge piece 13 which is used for making two-way connections such as between the floor and a wall or between the ceiling and a wall. As illustrated, edge piece 13 is generally "L" shaped in configuration having a pair of substantially orthogonal panel portions 13'. Panel portions 13', like panels 11 and corner pieces 14, may be constructed with opposed sheet members 13a, support portions 13b and lip portions 13c. Panel portions 13' may be constructed from the same material as panels 11 and corner pieces 14 and preferably include in their interiors acoustic insulation fill material.

Figure 9:
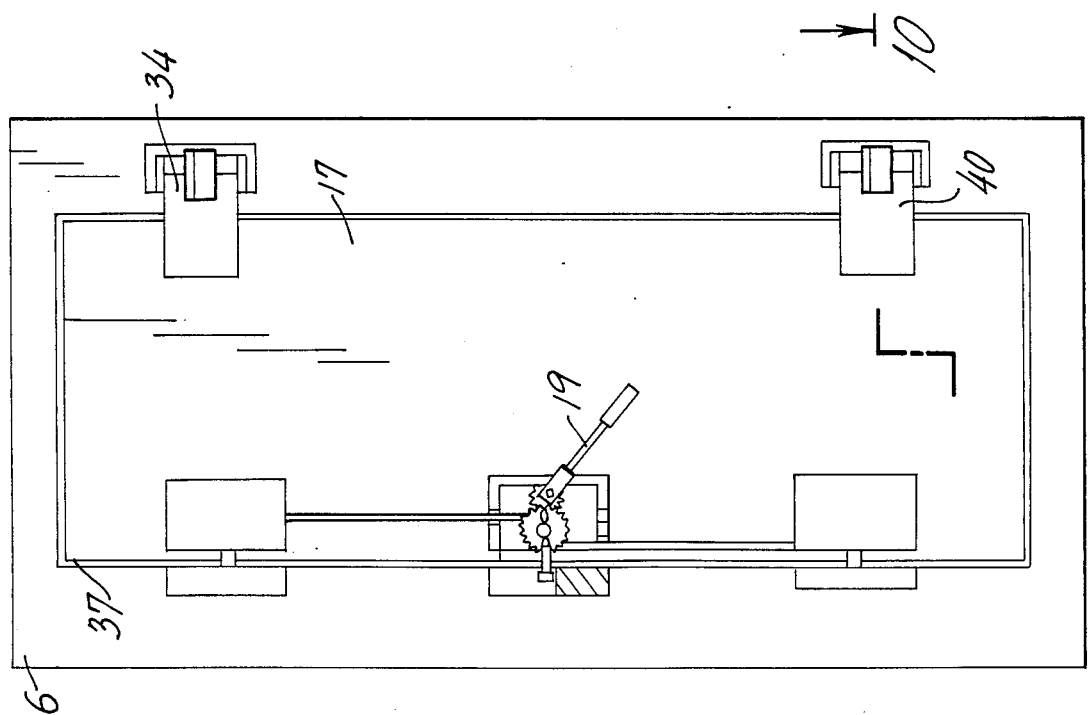
FIG. 9 is a print view of a door to the RF shielded and acoustic room.

Referring to FIG. 9, a front view illustrates the door 17 to the enclosure 10. The door 17 is fabricated from RF shielding material, e.g., sheet metal and filled with acoustic insulation. The door 17 is hung from a door frame 36 by hinges 34, 40. There are RF finger seals 37 on the interior of the door frame 36. At the corner of the door frame 36, the RF seal 337 is preferably rounded. This rounding of the RF seal 37 minimizes the chance of the seal being worn or broken, and eliminates a discontinuity in the fingers often associated with a shortfall in shielding effectiveness.

Figure 10:
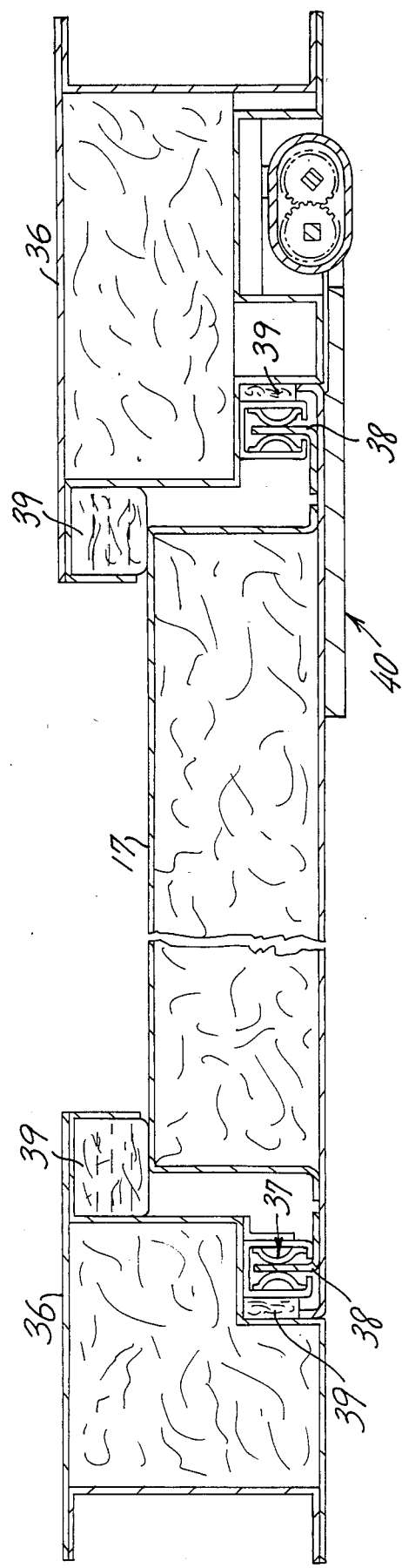
FIG. 10 is a cross sectional view of the door taken along line 10—10 of FIG. 9.

Referring now to FIG. 10, a cross-sectional view taken along line 10—10 of FIG. 9 illustrates the interior details of the door 17, frame 36 and the hinge 40. The RF shielded door frame 36 is provided with conductive finger seals 37 around the perimeter of the door frame. A projecting metallic strip 38 is disposed about the perimeter of the door 17. The strip 38 is inserted into the metallic finger seal 37 when the door 17 is closed. These seals 37 are contained in a protective channel around the entire perimeter of the door frame 36 and are mortised into the frame 36. The door 17 is flush with the frame 36. Double Acoustic seals 39 are integrated into the door frame 36. Seals 39 may be purely acoustic seals or may also include a surrounding RF gasketing mesh to provide RF shielding as well. A single cam action multi-point latch 19 (See FIG. 9) is used to draw the strip 38 on door 17 into the frame mounted finger seals 77 and the door into seals 39. The corners of the strip 38 are rounded so that the finger seals 37 will be continuous around the entire perimeter of the door frame 36. Therefore, troublesome finger seal corners are eliminated. The door 17 is preferably pre-hung at the factory to assure correct alignment. It will be noted that the subject door may be used in applications other than those specifically described herein, e.g. in welded structures.

Figure 11:
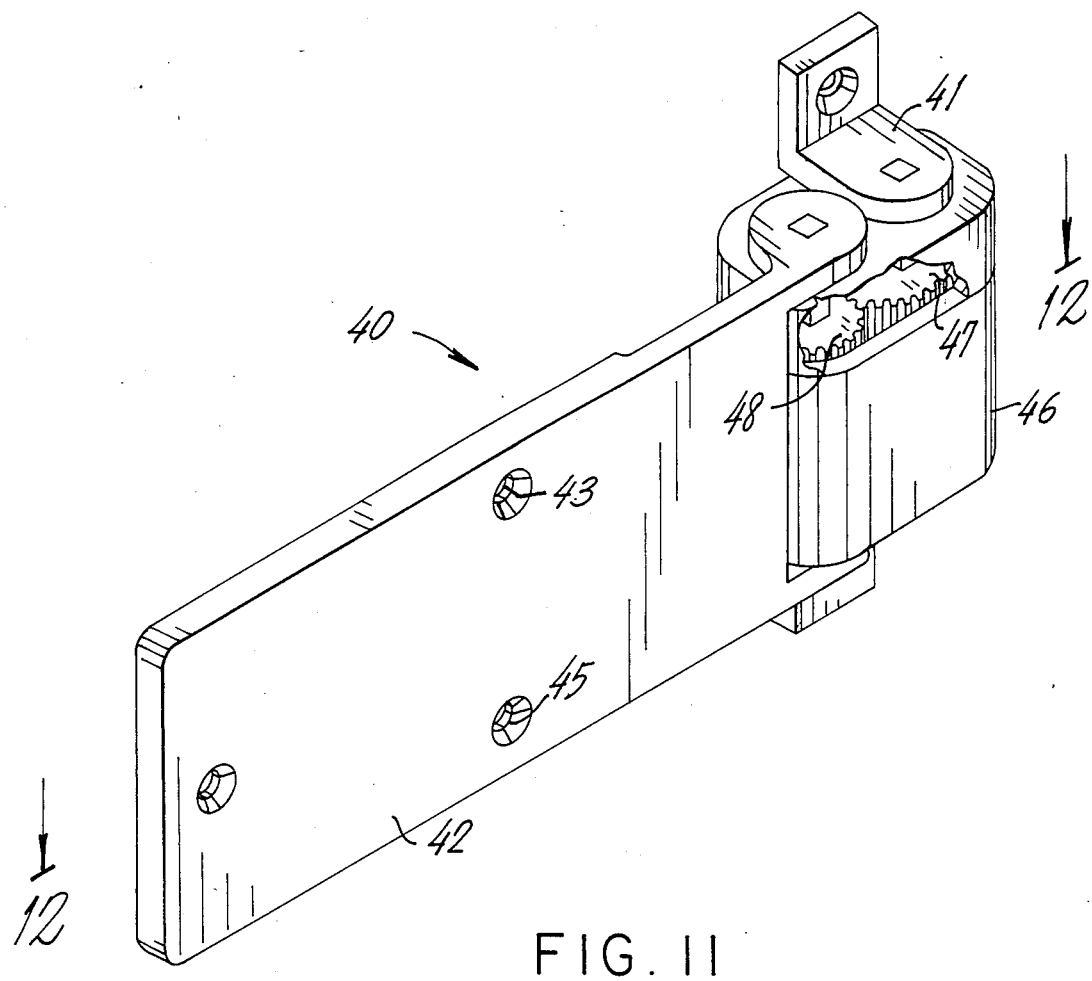
FIG. 11 is a perspective view of the hinge for use with the door.
Figure 12:
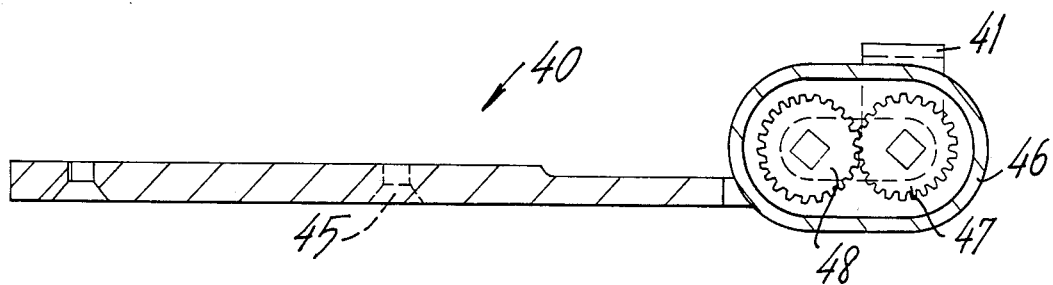
FIG. 12 is a cross sectional view of the hinge of FIG. 11 taken along line 12—12 of FIG. 11.

Referring now to FIGS. 11 and 12, a perspective view and cross-sectional view illustrate the hinge 40 for use with the door 17. The hinge 40 is secured to the frame 36 by bracket 41. An arm 42 extends from the hinge 40 and is secured to the door 17 by bolts which pass through holes 43–45. Within a housing 46, two gears 47, 48 are rotatably mounted. Gear 47 is fixed to bracket 41 and gear 48 is fixed to arm 42. The gears 47, 48 are connected together by the housing 46 and mesh with each other. In prior art doors the finger seals typically do not align well with the door knife edge 38 during initial opening of the door causing a loss of shielding effectiveness and excessive maintenance to repair seal damage. Hinge 40 reduces the lateral displacement of knife edge 38 from the center line of the finger seal array on the hinge side of the door minimizing seal damage and wear associated with the prior art In other words, the hinge structure of the invention gets knife edge 38 out of seals 37 as quickly as possible, thus reducing damage to the seals.

Preferably the door 17 is flush mounted. The flush mounting of an RF door is particularly difficult because of the alignment necessary for the RF seal and the strip projecting from the door. In the prior art, RF doors are typically surface mounted which enables the pivot point or hinge line to be in line with the lip of the RF seal. When the pivot point is aligned with the lip of the RF seal, the door edge can be inserted substantially straight into the lips bf the RF seal 37. Another alternative for aligning the pivot point, other than surface-mounting, is to recess the door hinge as illustrated in FIG. 10. A recessed door hinge, however, would normally prevent the door from opening 180°.

The hinge 40 overcomes these problems and allows the door to be flush mounted and to open 180°. As the door 17 is opened, the gear 48 rotates about the gear 47, until the door 17 is opened 180°. When the door is closing, the strip 38 on the door 17 is inserted with minimum misalignment into the lips of the RF seal 37. This arrangement provides a tight RF seal and minimizes the wear on the RF seal 37.

The apparatus of the present invention has the following advantages over known RF shielded rooms:

a. All panels 11, joiners 20, and doors 17 are acoustically rated per ASTM E90-84 and shielding effectiveness rated per NACSEM 5204 as assembled system and as individual components (panels and doors). The panels 11 and joiners 20 are acoustic rated STC 52 while the door 17 is acoustic rated STC 49 (high performance) and 36 (low performance). The assembled system is RF shielded effectiveness rated in excess of 100 dB from 100 k.Hz to 10 GHz High sound attenuation is achieved in addition to RF shielding without the need to "add-on" to the basic RF enclosure.
  b. The acoustic-RF wall system satisfies government physical security specifications. Hence, a fully secure facility is achieved in one structure without need for "add-on" or "room within a room" measures.
  c. The unique acoustic RF clamp system includes machine threaded fasteners 23 which assure that the structure is demountable and re-assembleable without a need to change fasteners or the basic joiners.
  d. The panels of the subject invention are rigid and do not deform in assembly. The clamping forces in assembly are absorbed by the RF gasketing materia which can be replaced with new gasketing material upon reassembly of any disassembled panels. The panels are fully reusable.

I claim:

1. A joint assembly for fastening a pair of panels for shielding electromagnetic waves comprising:
   (a) a generally "H" shaped joiner member formed from an electromagnetic wave shielding material, said joiner member having a pair of spaced apart flange members and a support member joining said flange members;
   (b) deformable electromagnetic shielding material disposable between said joiner flange members and said panels; and
   (c) means for fastening the panels together and compressing said joiner flange members, panel members and the electromagnetic shielding material disposed there between so as to form a continuous electromagnetic wave shield, wherein said fastening means comprises a pair of generally "U" shaped channel members, each having a pair of leg portions joined by a base portion.

2. A joint assembly as recited in claim 1, said joint assembly further including screw means receivable in said channel members and joiner flange members such that tightening of said screw means effects the tightening of said channel leg members against said joiner flange members and the compression of the joiner flange members, the panels and the electromagnetic wave shielding material disposed there between.

3. A joint assembly as recited in claim 1 wherein each end of said joiner flange member includes a recessed portion for receiving said electromagnetic wave shielding material.

4. A joint assembly comprising:
   a pair of panels members wherein each of said panel members comprises a pair of spaced apart face members separated by a U-shaped support wall member at the periphery of the face members, said support wall member and at least one of said face members being formed from an electromagnetic wave shielding material;
   a generally "H" shaped joiner member formed from an electromagnetic wave shielding material, said joiner member having a pair of spaced apart flange members and a support member joining said flange members;
   deformable electromagnetic shielding material disposable between said joiner flange members and said panels; and
   means for fastening the panels together and compressing said joiner flange members, panel members and the electromagnetic shielding material disposed there between so as to form a continuous electromagnetic wave shield, wherein said fastening means comprises a pair of generally "U" shaped channel members, each having a pair of leg portions joined by a base portion.

5. A joint assembly as recited in claim 4 wherein each leg portion of said channel members is aligned with a portion of the panel support wall member.

6. A joint assembly is recited in claim 4 wherein each said panel member is filled with an acoustic insulation material.

7. A door assembly for an RF and acoustical shielded enclosure which comprises:
   a frame;
   a continuous rectangular sheet metal panel filled with acoustic insulation and rotatably mounted within said frame;
   a metallic strip projecting from the periphery of said panel, said metallic strip being rounded at the corners of the panel;
   conductive fingers disposed about the periphery of the frame and cooperating with said metallic strip, and
   hinges which are recessed into the frame so as to allow the sheet metal panel to be flush mounted and to open 180°.

8. An enclosure for shielding electromagnetic waves comprising:
   (a) plurality of panel members each of which includes a pair of spaced apart face members joined by a peripheral support wall member, said support wall member and at least one of said face members being constructed from an electromagnetic shielding material;

(b) a joint assembly for fastening pairs of said panels comprising:

(i) a generally "H" shaped joiner meber formed from an electromagnetic wave shielding material, said joiner member having a pair of spaced apart flange members and a support member joining said flange member;

(ii) deformable electromagnetic shielding material disposable between said joiner flange members and said panels; and (iii) means for fastening the panels together and compressing said joiner flange members, panel members and the electromagnetic shielding material disposed therebetween so as to form a continuous electromagnetic wave shield, said fastening means including a pair of generally "U" shape channel members, each having a pair of leg portions joined by a base portion, said joint assembly further including screw means receivable in said channel members and joiner flange members such that tightening of said screw means effects the tightening of said channel leg members against said joiner flange members and the compression of the joiner flange members, the panels and the electromagnetic wave shielding material disposed therebetween, each leg portion of said channel members being aligned with a portion of the panel support wall member.

9. The enclosure as recited in claim 8 wherein each of said panel members includes acoustic insulation material in the interior thereof.

10. An enclosure as recited in claim 8 which further comprises a corner member for joining three substantially orthogonal panel members and providing continuous electromagnetic wave shielding along the joint of said panels, said corner member including three substantially orthogonal panel portions, each of said panel portions including a pair of spaced apart, opposed face members and a peripheral support wall portion joining said spaced apart corner face members, said wall portion and at least one of the opposed face members of each said panel portion being formed from an electromagnetic wave shielding material.

11. The enclosure of claim 10 in which each of said panel portions is filled with an acoustic insulation material.

12. An enclosure as recited in claim 8 which further comprises an edge member for joining two substantially orthogonal panel members and providing continuous electromagnetic wave shielding along the joint of said panel members, comprising two substantially orthogonal panel portions including a pair of spaced apart, opposed face members and a peripheral support wall portion joining said spaced apart edge face members, said wall portion and at least one of the opposed face members of each of said panel portions being formed from an electromagnetic wave shielding material.

13. An enclosure as recited in claim 12 wherein each of the panel portions of said edge member is filled with an acoustic insulation material.

14. An enclosure as recited in claim 8 which further comprises:

a frame;

a continuous rectangular sheet metal panel filled with acoustic insulation and rotatably mounted within said frame;

a metallic strip projecting from the periphery of said panel, said metallic edge being rounded at the corners of the panel; and conductive fingers disposed about the periphery of the frame and cooperating with said metallic strip.

15. An enclosure for shielding electromagnetic waves comprising:

(a) plurality of panel members each of which includes a pair of spaced apart face members joined by a peripheral support wall member, said support wall member and at least one of said face members being constructed from an electromagnetic shielding material;

(b) a joint assembly for fastening pairs of said panel members comprising:

(i) a generally "H" shaped joiner member formed from an electromagnetic wave shielding material, said joiner member having a pair of spaced apart flange members and a support member joining said flange members;

(ii) deformable electromagnetic shielding material disposble between said joiner flange members and said panel members; and (iii) means for fastening the panel members together and compressing said joiner flange members, panel members and the electromagnetic shielding material disposed there between so as to form a continuous electromagnetic wave shield, said fastening means including a pair of generally "U" shape channel members, each having a pair of leg portions joined by a base portion, said joint assembly further including screw means receivable in said channel members and joiner flange members such that tightening of said screw means effects the tightening of said channel leg members against said joiner flange members and the compression of the joiner flange members, the panel members and the electromagnetic wave shielding material disposed there between, each leg portion of said channel members being aligned with a portion of the panel support wall member; and (c) a door assembly comprising a frame;

a continuous rectangular sheet metal panel filled with acoustic insulation and rotatably mounted within said frame;

a metallic strip projecting from the periphery of said panel, said metallic strip being rounded at the corners of the panel;

conductive fingers disposed about the periphery of the frame and cooperating with said metallic strip; and hinges which are recessed into the frame so as to allow the sheet metal panel to be lushed mounted and to open 180°.

16. An enclosure as recited in claim 15 wherein each of said hinges comprises:

a bracket;

a first gear nonrotatably mounted within said bracket;

a second gear linked to said first gear and rotatable about said first gear; and an arm connected to said second gear, said arm for being connected to the continuous rectangular sheet metal panel.

17. An enclosure as recited in claim 16 wherein each of said hinges further includes a housing within which said first and second gears are disposed.

18. An enclosure for shielding electromagnetic waves comprising:
- a panel member for shielding electromagnetic waves comprising a pair of spaced apart face members separated by a U-shaped support member at the periphery of the face members and wherein said U-shaped support member and at least one of said face members are constructed from an electromagnetic shielding material; and
- a joint assembly comprising:
  - a generally "H" shaped joiner member formed from an electromagnetic wave shielding material, said joiner member having a pair of spaced apart flange members and a support member joining said flange members;
  - deformable eletromagnetic shielding material disposable between said joiner flange members and said panel member; and
  - means for fastening panel members together and compressing said joiner flange members, panel members and the electromagnetic shielding material disposed there between so as to form a continuous electromagnetic wave shield, said fastening means comprising a pair of generally "U" shaped channel members, each having a pair of leg portions joined by a base portion; and
- wherein each leg portion of said channel member is aligned with a base portion of the U-shaped support member such that a line of compression occurs between the leg portion of the channel member and the base portion of the U-shaped support member at the periphery of the face members.

19. An enclosure for shielding electromagnetic waves comprising:
- a panel member for shielding electromagnetic waves comprising a pair of spaced apart face members separated by a U-shaped support member at the periphery of the face members and wherein said U-shaped support member and at least one of said face members are constructed from an electromagnetic shielding material; and
- a joint assembly comprising:
  - a generally "H" shaped joiner member formed from an electromagnetic wave shielding material, said joiner member having a pair of spaced apart flange members and a support member joining said flange members;
  - deformable electromagnetic shielding material disposable between said joiner flange members and said panel member; and
- means for fastening two panel members together and compresssing said joiner flange members, panel members and the electromagnetic shielding material disposed there between so as to form a continuous electromagnetic wave shield; and
- wherein the means for fastening and a base portion of the U shaped support member form a line of compression at the periphery of the face members.

20. The enclosure of claim 19 wherein the panel member further comprises acoustic insulation material between the face members within the periphery defined by the U-shaped support member and wherein the panel member and joint assembly have an acoustic rating STC 50-55.

* * * * *